(12) United States Patent
Black, Jr. et al.

(10) Patent No.: US 6,675,056 B1
(45) Date of Patent: Jan. 6, 2004

(54) INTELLIGENT COMPONENT FEEDER SYSTEM

(75) Inventors: Robert J. Black, Jr., Chapel Hill, NC (US); Gerald Ian Padnos, Holly Springs, NC (US); Yoichi Enomoto, Morrisville, NC (US); David Mark Kvavle, Schnottwil (CH); Daniel Bleisch, Bellach (CH)

(73) Assignee: Juki Corporation, Tokyo (JP)

( * ) Notice: Subject to any disclaimer, the term of this patent is extended or adjusted under 35 U.S.C. 154(b) by 0 days.

(21) Appl. No.: 10/003,687

(22) Filed: Nov. 14, 2001

Related U.S. Application Data

(60) Provisional application No. 60/261,308, filed on Jan. 13, 2001.

(51) Int. Cl.[7] ................................................ G06F 17/00
(52) U.S. Cl. ........................ 700/116; 700/231; 235/375
(58) Field of Search .................... 29/854–856; 700/116, 700/114, 115, 231; 231/6, 14, 25, 73; 235/375

(56) References Cited

U.S. PATENT DOCUMENTS

| | | | | |
|---|---|---|---|---|
| 5,325,305 A | * | 6/1994 | Rezaei | 700/114 |
| 5,874,323 A | * | 2/1999 | Goins, III | 438/121 |
| 6,027,019 A | * | 2/2000 | Kou | 235/375 |
| 6,089,687 A | * | 7/2000 | Helterline | 347/7 |
| 6,157,870 A | * | 12/2000 | Gfeller et al. | 700/231 |
| 6,530,517 B1 | * | 3/2003 | Kou | 235/375 |

FOREIGN PATENT DOCUMENTS

JP 10256783 A * 9/1998 .......... H05K/13/02

* cited by examiner

Primary Examiner—Leo Picard
Assistant Examiner—Douglas S. Lee
(74) Attorney, Agent, or Firm—Thelen Reid & Priest, LLP; David B. Ritchie

(57) ABSTRACT

An intelligent component feeder includes a lever-powered mechanical component feed system and a memory device mounted on the mechanical feed system. The memory device has a two-terminal electrical interface, the two terminals are associated with data and data ground, respectively. The memory device, which is preferably of a non-volatile, rewritable type, contains information indicating a component ID, component Lot Number, feeder serial number, feeder type, number of feeder actuations, and a Quantity value for a reel of components mounted on the component feeder. The intelligent component feeder further includes a data connector for coupling data from the memory device to a data adapter of a placement device. The data connector comes into contact with the data adapter when the intelligent component feeder is installed on the placement device. The terminal associated with data ground is coupled with a body of said intelligent component feeder.

23 Claims, 10 Drawing Sheets

INTELLIGENT COMPONENT FEEDER SYSTEM

RELATED APPLICATIONS

This application claims the benefit of provisional U.S. patent application Ser. No. 60/261,308 filed on Jan. 13, 2001 in the names of the same inventors.

FIELD OF THE INVENTION

The present invention is directed to an intelligent component feeder system for use in robotic assembly devices such as pick and place machines (also known as placement machines or placement equipment). More particularly, the present invention is directed to a system for tracking the contents of a particular component feeder and enabling a host computer to recognize the feeder and its contents when the component feeder is coupled to a network to which the host computer is connected.

BACKGROUND OF THE INVENTION

Robotic assembly machines are well known in the art. Such devices, which include pick and place machines, are used, for example, in the assembly of electronic printed circuit boards (PCBs). In a conventional pick and place machine, one or more pick-up heads which are movable in X, Y, Z and rotation directions are directed to pick up electronic and similar components from pick-up stations normally supplied with components from a reel held in a component feeder containing a relatively large supply of a particular component. The force used to pick up the components is typically supplied by a vacuum air supply, a mechanical gripper or the like. Once the component is picked up, it is oriented, normally by optical means, and transported to a placement location on a substrate such as a PCB where it is placed. After all components are placed on the PCB, the PCB is normally run through a reflow oven where solder contacts are reflowed to form permanent electrical connections between pads of the PCB and various types of contact pins belonging to the electronic components.

Pick and place machines typically have a number of feeder stations which receive component feeders. Component feeders come in a number of well known standard widths to accommodate standard component reels. In conventional pick and place machines, a program running on a host computer which controls the machine and its operation (the controller) is manually told which feeder station has which components loaded. If an incorrect feeder is put in place and the host computer is not informed, there is generally no way for the pick and place machine to avoid placing incorrect components on the circuit board resulting in a zero manufacturing yield.

Conventional mechanical component feeders operate entirely mechanically. An actuator such as a rod, pin or lever driven by the machinery of the pick and place machine moves under the control of the controller of the pick and place machine. The actuator pushes against a lever of the mechanical component feeder and causes a mechanical response which results in advancing the next component onto the feeder pickup position.

Recently, a number of companies have introduced electronic component feeders. Such devices have their own electrical drive components, motors, microprocessors and other complex circuitry and componentry. These devices provide additional functionality over conventional mechanical component feeders but they have several drawbacks. First, because they are more complex, they are necessarily less reliable. Second, the added complexity comes at a significant cost premium to existing mechanical component feeders. Third, a customer desiring to convert to such electronic component feeders must purchase entirely new pick and place machines, control equipment, feeders and other items. Such conversions may in many cases be prohibitively expensive and do not make use of existing, relatively expensive and still operable equipment, resulting in waste.

When constructing complex PCBs for use in certain types of applications, e.g., airplanes, spacecraft, automobiles, and the like, it is becoming important to be able to determine long after the assembly of the PCB whether an electrical component of a specific type from a specified lot number is part of the assembled PCB. This is referred to as "traceability". For example, when components from a particular lot are determined to have a particularly high failure rate or to contain potentially dangerous errors or defects, it would be desirable to determine which critical PCBs include the potentially defective components so that they can be readily identified, located and checked or replaced prior to failure without the need for checking or replacing all similar boards. Conventional robotic assembly equipment provides no convenient way for providing traceability, i.e., linking component lot numbers with specific assembled PCBs.

Accordingly, it would be desirable to provide an intelligent component feeder system which is retrofitable into existing equipment, makes use of reliable and proven mechanical feeder technology, provides traceability, and is relatively easy and inexpensive to implement.

BRIEF DESCRIPTION OF THE INVENTION

An intelligent component feeder system includes an intelligent component feeder, an adapter interface for receiving the component feeder and forming needed electrical contacts therewith, and computer software running on a computer system controlling robotic placement equipment. The intelligent component feeder is adapted from a conventional mechanical component feeder and additionally includes a nonvolatile serial memory device which can be accessed using two electrical conductors, a data line and a data ground line. One of the electrical conductors (the data line) is connected to the adapter interface via a spring-type contact so that when the component feeder is placed for use with the robotic placement equipment, an electrical contact is made to the serial memory device through the spring-type contact of the interface adapter. The second of the electrical conductors (the data ground line) is tied to the metal body of the component feeder. Electrical contact is made when the component feeder is clamped into place on the robotic placement equipment. The component feeder holds a reel of components. A bar code label is placed on the reel identifying information about the components stored thereon, such as ID, Lot Number, Quantity, feeder serial number, feeder type, number of feeder actuation, and the like. Each time that the component feeder is placed on the machine, the bar code label on its reel must be read in order to confirm a match between the reel and the data stored in the memory device. When a component reel is removed from the feeder, a new bar code label is generated reflecting any change in the quantity of components stored on the reel. The new bar code label is placed over or replaces the existing bar code label. The software is aware of each component feeder through the adapter interface and knows its feeder position, the ID of the components loaded thereon, the Lot Number of those components, approximate remaining quantity, feeder serial number, and the like.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of an intelligent component feeder system. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

The Intelligent Component Feeder.

Figure 1:
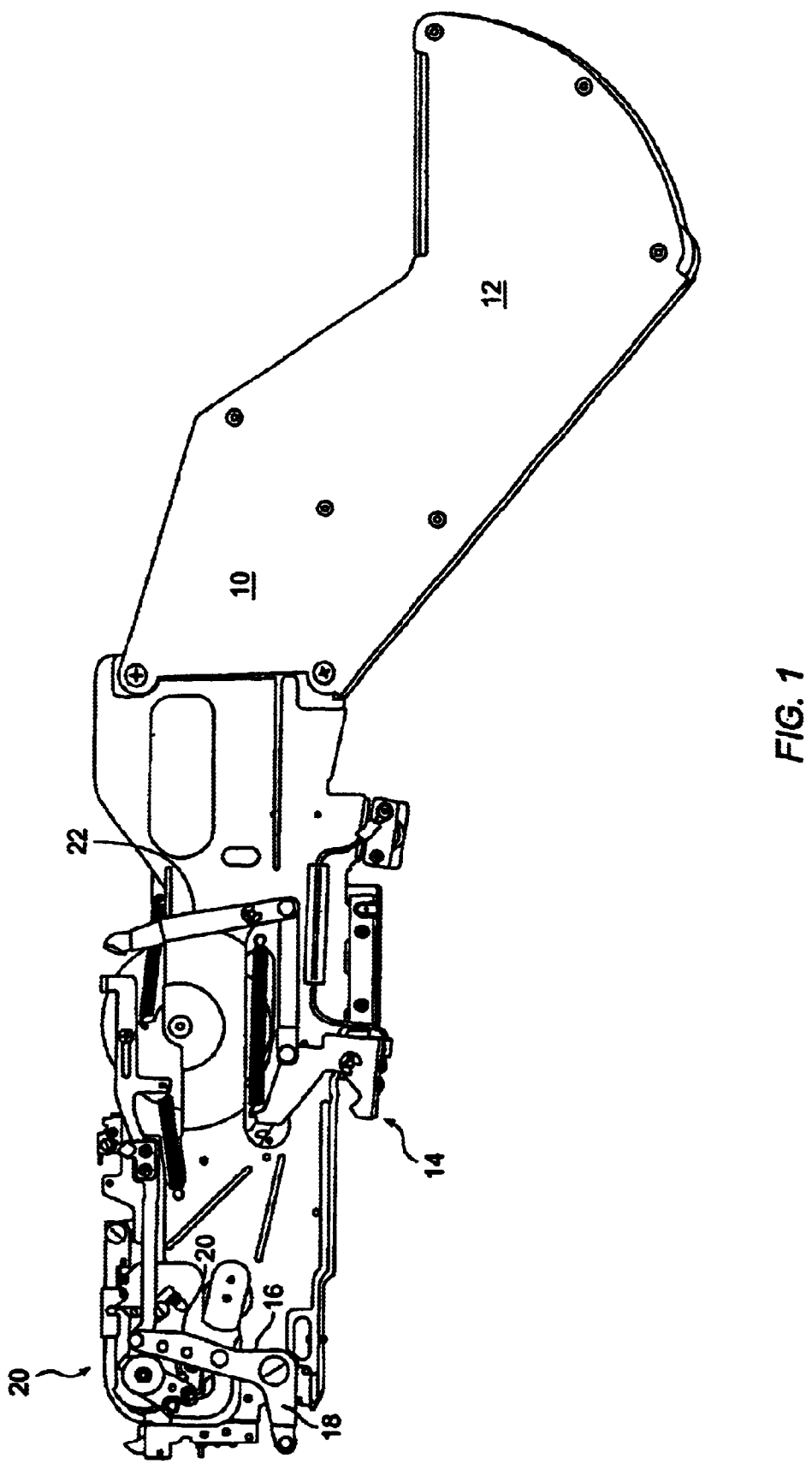
FIG. 1 is a plan view of the layout of an intelligent component feeder in accordance with a specific embodiment of the present invention.

The intelligent component feeder is illustrated in FIGS. 1–4. FIG. 1 illustrates an overall top plan view of the intelligent component feeder 10 in accordance with a specific embodiment of the present invention. Intelligent component feeder 10 includes a portion shown at the right of FIG. 1 and labeled 12 where a component reel (not shown) is to be loaded. Intelligent component feeder 10 as shown in FIG. 1 is simply a conventional mechanical component feeder of the 8 mm width type in accordance with the prior art modified with the memory feature in accordance with a specific embodiment of the present invention. Intelligent component feeder 10 includes a gripper 14 for attaching the component feeder 10 to a gripper bar for physical attachment to placement equipment. Components are fed from the component reel with a stepping mechanism 16 powered by an external actuator (not shown) located on the placement equipment pushing against lever arm 18 prior to each pick of a component from component pick position 20. To load or unload intelligent component feeder 10 from the gripper bar one pulls on lever 22 which releases gripper 14 from the gripper bar by rotating it counterclockwise as shown in FIG. 1.

Figure 2:
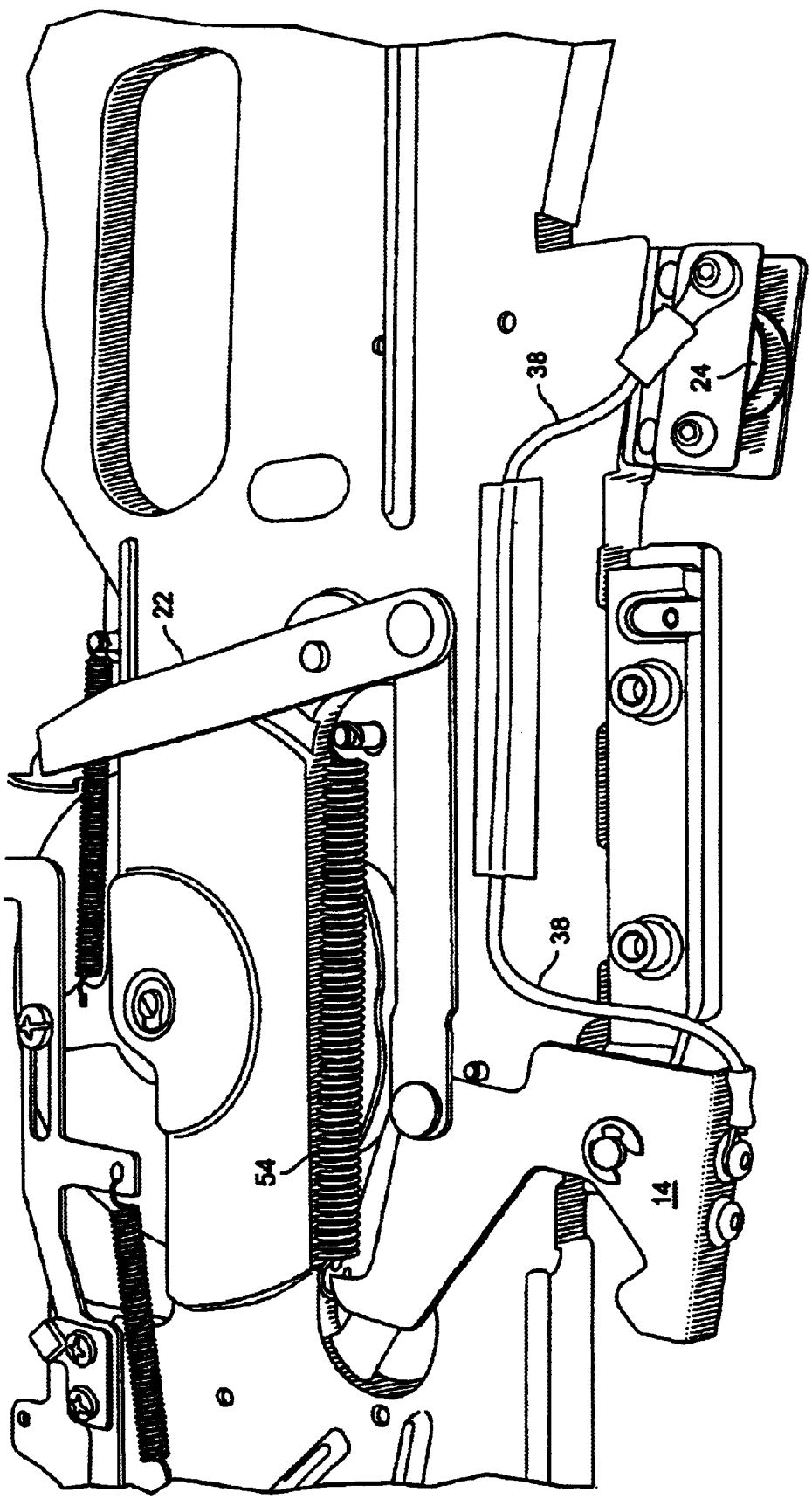
FIG. 2 is a diagram illustrating modifications made to a conventional mechanical component feeder in accordance with a specific embodiment of the present invention.

The modifications to a conventional mechanical component feeder are illustrated in FIG. 2. Memory unit 24 is added in a location which will not mechanically interfere with component feeder operation. In accordance with a specific embodiment of the present invention the memory used is a serial-type 2-contact memory device (data and data ground) of the non-volatile multiple time writable type. For example, a suitable type of memory device is the iButton model no. DS-1996 non-volatile read/write memory having a 64-bit unique serial number and 64Kbits of memory in which data can be partially or completely overwritten. The iButton line of products is available from Dallas Semiconductor of Dallas, Texas. Those of ordinary skill in the art will now realize that other types of memory will also work, such as EEPROM (electrically eraseable programmable read only memory) and other types of non-volatile memory devices.

Figure 3:
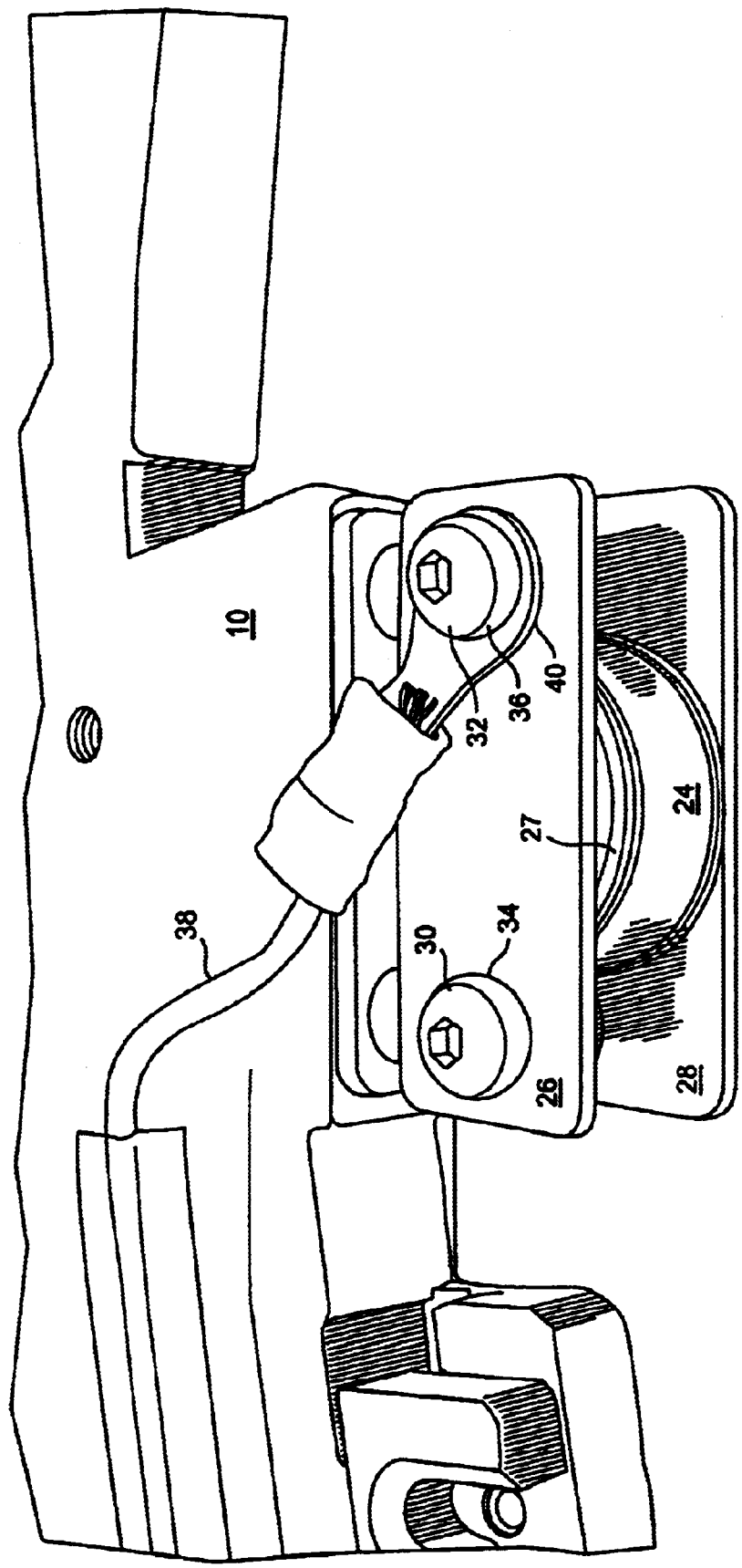
FIG. 3 is a diagram illustrating the mounting of a memory module feeder in accordance with a specific embodiment of the present invention.
Figure 4:
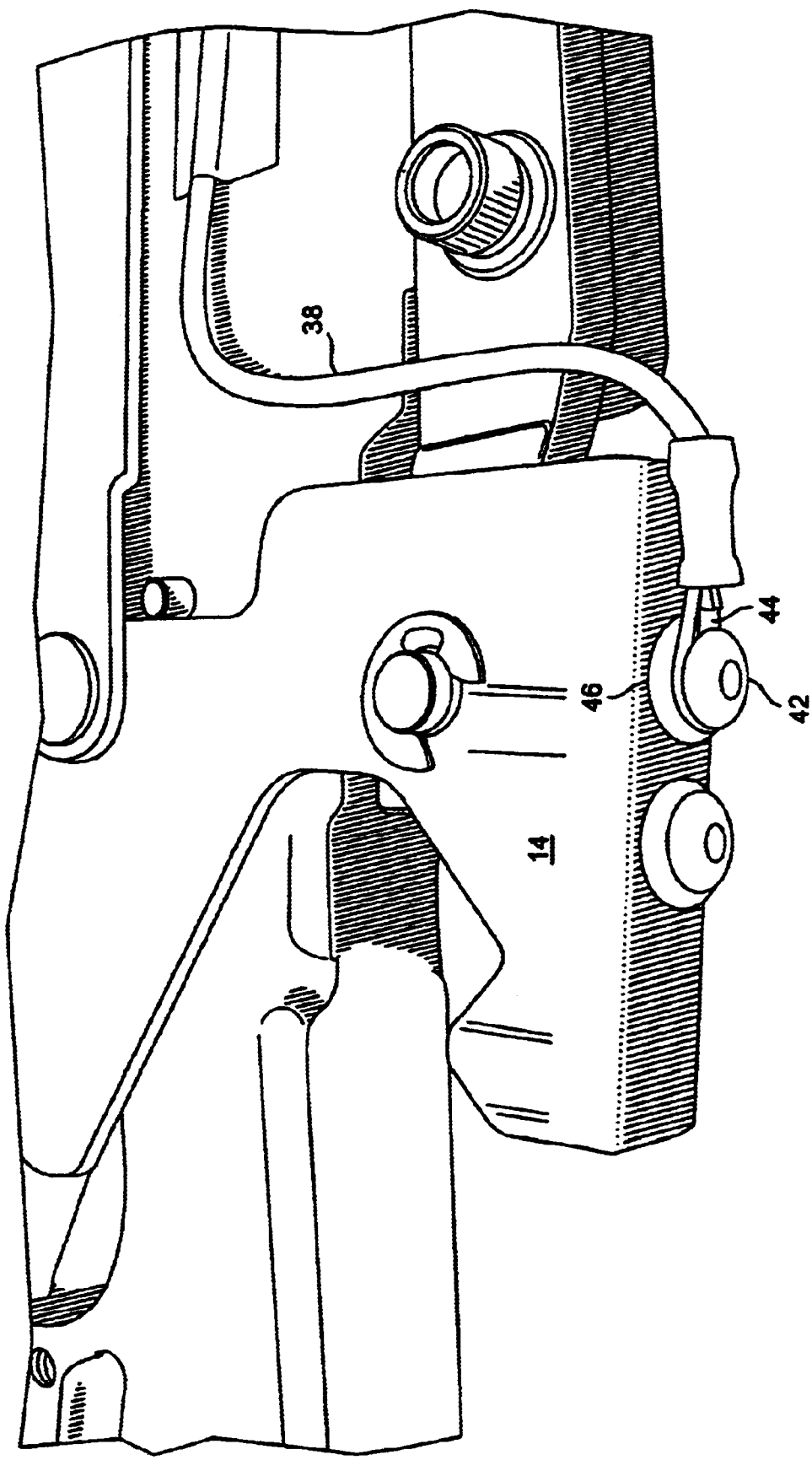
FIG. 4 is a diagram illustrating electrical connections carrying the data signal from the memory module to a gripper assembly in accordance with a specific. embodiment of the present invention.

Turning now to FIG. 3, a view of the mounting arrangement for the memory unit 24 is illustrated. In accordance with this specific embodiment of the invention, memory unit 24 is sandwiched between two conductive plates 26 and 28. Plate 26 is electrically coupled to the data line (27) of memory device 24 and plate 28 is electrically coupled to the data ground line (not shown, provided on the other side) of memory device 24. Plate 28 is also coupled to the body of the component feeder 10 which serves as a ground return. Plate 26 is bolted to plate 28 with bolts 30 and 32 and is electrically insulated from plate 28 with insulators 34 and 36. A conductive wire or flexible or circuit board 38 coupled to plate 26 with a conductive lug 40 carries the data signal to bolt 42 (FIG. 4) via lug 44 which is insulated from gripper 14 with insulator 46.

The Interface Adapter.

Figure 5A:
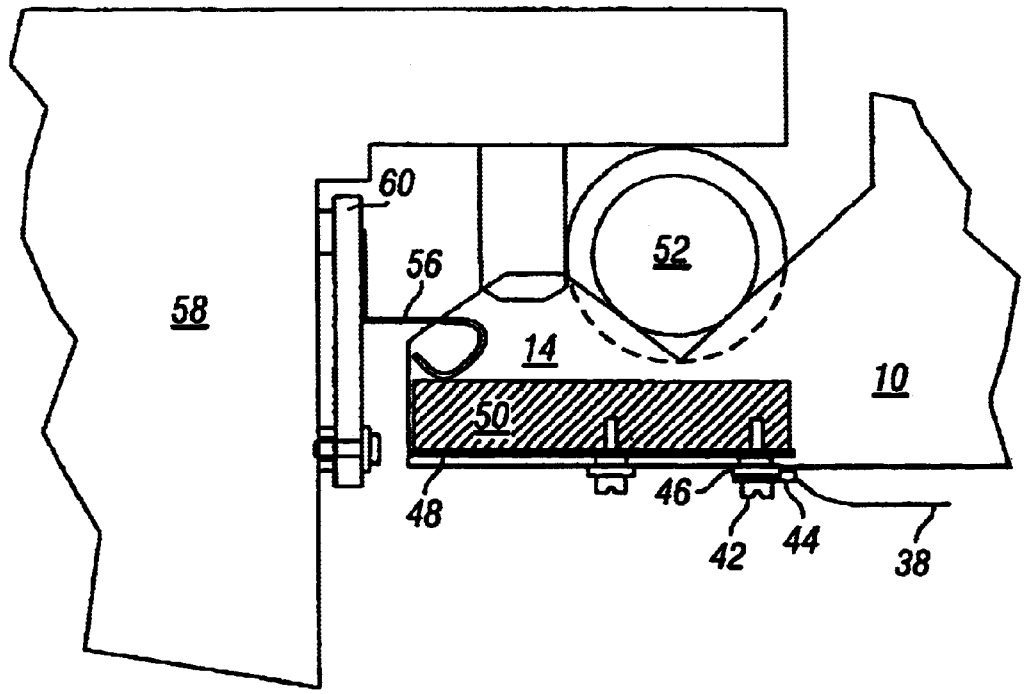
FIGS. 5A is an elevational drawing illustrating attachment of an intelligent component feeder to placement equipment in accordance with a specific embodiment of the present invention.

Turning now to FIG. 5A the inside of the gripper 14 can be seen which shows how the data signal is coupled off of the component feeder 10 to a placement equipment 58. The placement equipment 58 has typically a number of feeder stations each receiving a component feeder 10. FIG. 5A illustrates the component feeder 10 received in one of such feeder stations. An insulator 48, such as a film of 5 mil (0.127 mm) Mylar™ or Kapton™, for example, holds conductive contact plate 50 electrically away from the body of component feeder 10. Gripper 14 holds onto gripper bar 52 of the placement equipment. The spring 54 (FIG. 2) biases gripper 14 closed against gripper bar 52. The gripper 14 can be released by pulling on lever 22. When lever 22 is released, contact plate 50 is brought into electrical contact with a spring-type contact 56 disposed on a printed circuit board 60 attached to the placement equipment 58. A Battery Contact Type 5230 available from the Keystone Corporation may be used as may any other suitable electrical contact for spring-type contact 56.

Figure 5B:
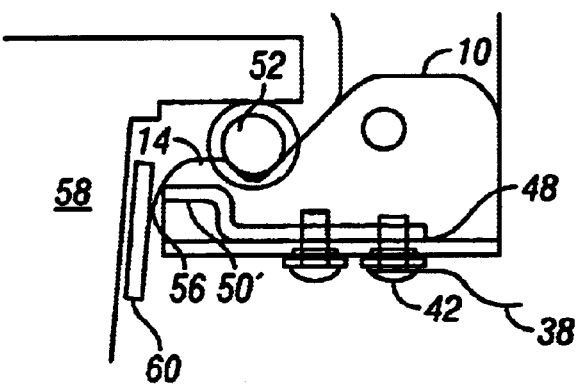
FIG. 5B is an elevational drawing illustrating attachment of an intelligent component feeder to placement equipment in accordance with a specific embodiment of the present invention.

It is presently preferred to dispose spring-type contacts on the placement equipment 58 and use a flat contact plate 50 disposed on the component feeder 10 rather than to dispose the spring-type contact on the component feeder 10 to make contact with a contact plate on the placement equipment, although both approaches would work. FIG. 5B illustrates another example of the coupling between spring-type contact 56 disposed on a printed circuit board 60 and a modified contact plate 50'. As shown in FIG. 5B, the contact plate 50' is curved to provide a contact point with the spring type contact 56, whereby simplifying the configuration of the spring-type contact 56.

By allocating the feeder ground as one of the two communication lines (i.e., data line and data ground line) of the memory device 24 (FIG. 2), as described above, the memory device 24 can communicate with the placement equipment 58 through only one contact via the spring-type contact 56, as shown in FIGS. 5A and 5B. The gripper bar 52 receives the ground return from the intelligent component feeder 10, serving as a data ground line. The gripper bar 25 may be grounded or coupled to a ground line.

Figure 6B:
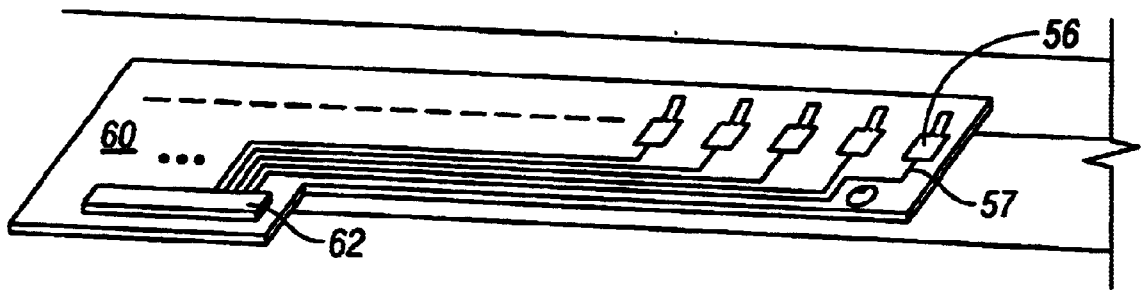
FIG. 6B is a drawing illustrating the electrical contact assembly for placement equipment in accordance with a specific embodiment of the present invention.
Figure 6A:
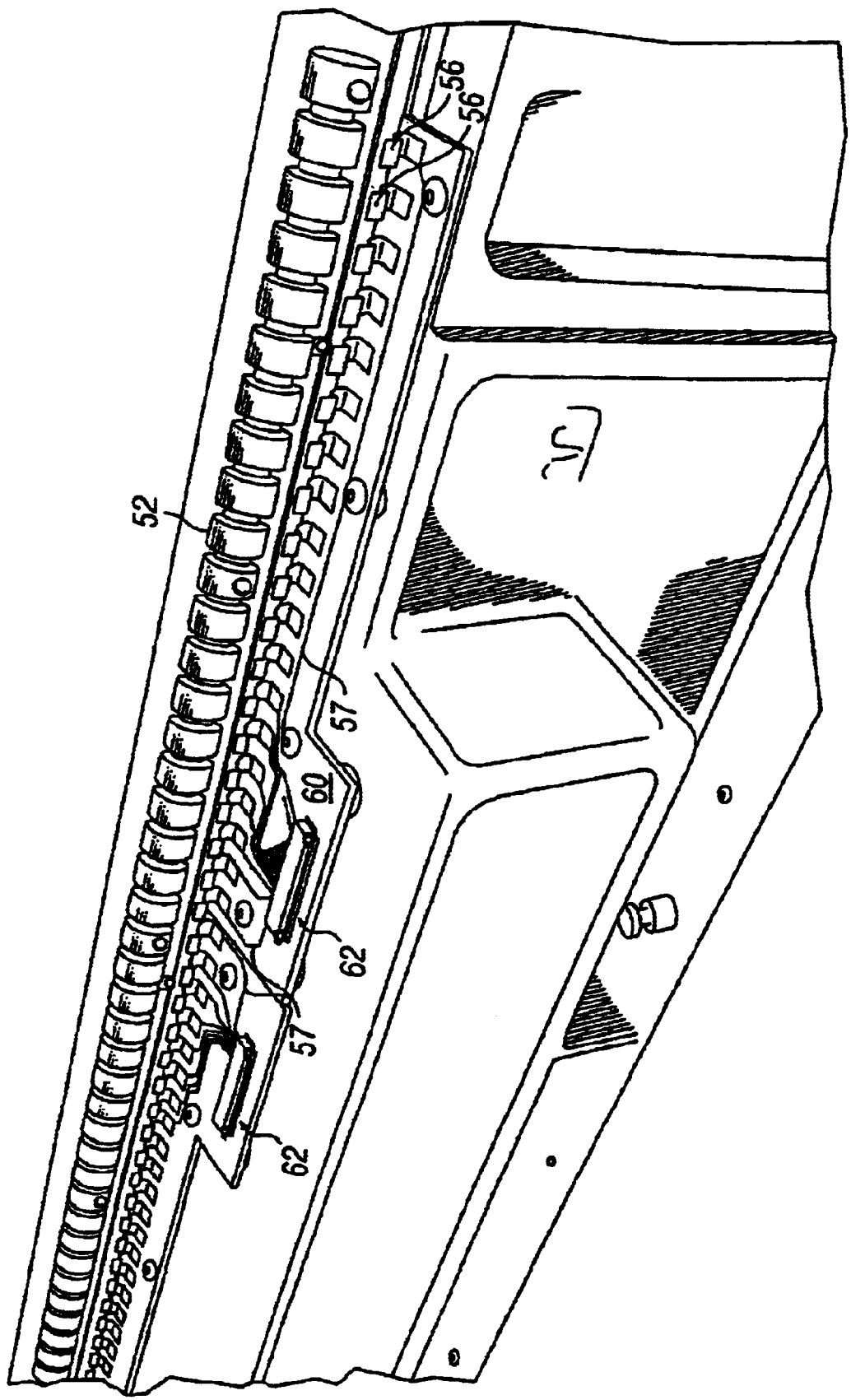
FIG. 6A is a drawing illustrating the gripper bar and electrical contact assembly for placement equipment in accordance with a specific embodiment of the present invention.
Figure 7:
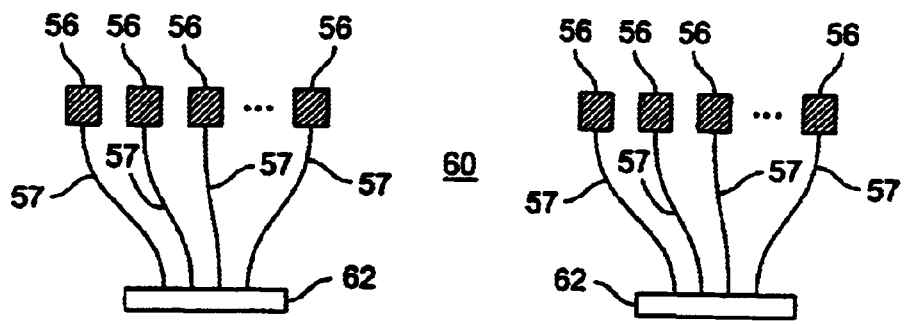
FIG. 7 is a block diagram illustrating electrical contacts and connectors for placement equipment in accordance with a specific embodiment of the present invention.

Turning now to FIGS. 6A and 7, a printed circuit board 60 and gripper bar 52 are illustrated. Normally they would be oriented vertically as shown in FIGS. 5A or 5B. Gripper bar 52 (FIG. 6A) is notched to provide registration for component feeders in the conventional manner. FIG. 6B illustrates another example of contact springs 56 disposed on the printed circuit board 60, which is in accordance with the configuration shown in FIG. 5B. In either case, contact springs 56 are positioned for contact with properly registered component feeders. Each contact spring 56 is electrically coupled to a printed circuit trace 57 on the printed circuit board 60 which leads to one of block connectors 62 as shown in FIG. 7. Cables (not shown) couple connectors 62 with computer equipment for controlling the operation of the placement equipment.

System Configuration.

Figure 8:
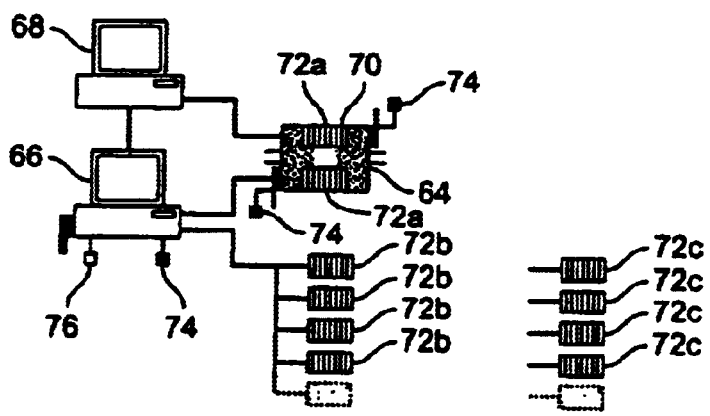
FIGS. 8–10 are system block diagrams illustrating various configurations of placement equipment and intelligent component feeders in accordance with specific embodiments of the present invention.

Turning now to FIG. 8, a typical configuration of a placement machine in accordance with a specific embodiment of the present invention is illustrated. In FIG. 8 placement machine 64 operates under the control of a computerized controller 66 and optionally other controllers 68 which are coupled to the placement machine 64 and to each other using various types of known network technologies, such as ArcNet, Ethernet, CanBus, and wireless networking. Controllers 68 are preferably coupled to placement machine 64 using ArcNet, controllers 68 are preferably coupled to controllers 66 using Ethernet, and controllers 66 are preferably coupled to placement machine 64 and in-line and on-line feeder trolleys using CanBus. In addition, wireless communication may be used for all or any part of the networking. For example, a wireless LAN using infrared or radio waves may be used for networking on-line feeder trolleys and/or for communication between a feeder trolley and feeders. Such wireless communication may be implemented by installing a conventional wireless modem or transceiver on each of feeder trolleys and/or feeders.

Intelligent Feeders 70 are mounted on feeder trolleys 72 (72a, 72b, 72c). Feeder trolleys which are being used to feed components to the placement machine 64 are known as "In-Line" trolleys and are designated "72a" in FIG. 8. Feeder trolleys which are networked but not positioned for use are known as "On-Line" trolleys and are designated "72b" in FIG. 8. Feeder trolleys which are not networked and not positioned for use are known as "Off-Line" trolleys and are designated "72c" in FIG. 8. As mentioned above, wireless communication technique may be used to communicationon-line feeder trolleys and/or for communication between feeders and feeder trolleys.

Placement machine 64 is equipped with one or more bar code scanners 74 including a bar code scanner mounted on the pick-up head which can read bar codes disposed on the print circuit boards (PCBs) being assembled. Additional bar code scanners may also be disposed at convenient locations in the system to permit scanning of component feeder reels. Bar code label printers 76 are also disposed at one or more convenient locations in the system to provide updated bar code labels for reels to reflect updated approximate component quantities on those reels after they are demounted from a component feeder (and thus are no longer physically coupled to a memory device containing a current component count).

Figure 9:
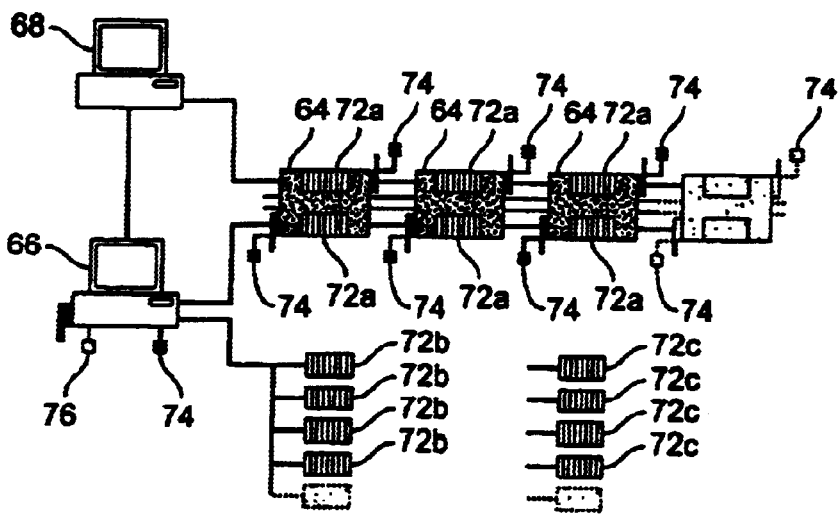

FIG. 9 is a system block diagram illustrating a typical single-line configuration in accordance with one embodiment of the present invention. As shown in FIG. 9, the system includes a line having a plurality of placement machines 64 which operate under the control of controller 66 and optional controllers 68. The other features of the system is the same as discusses above referring to FIG. 8.

Figure 10:
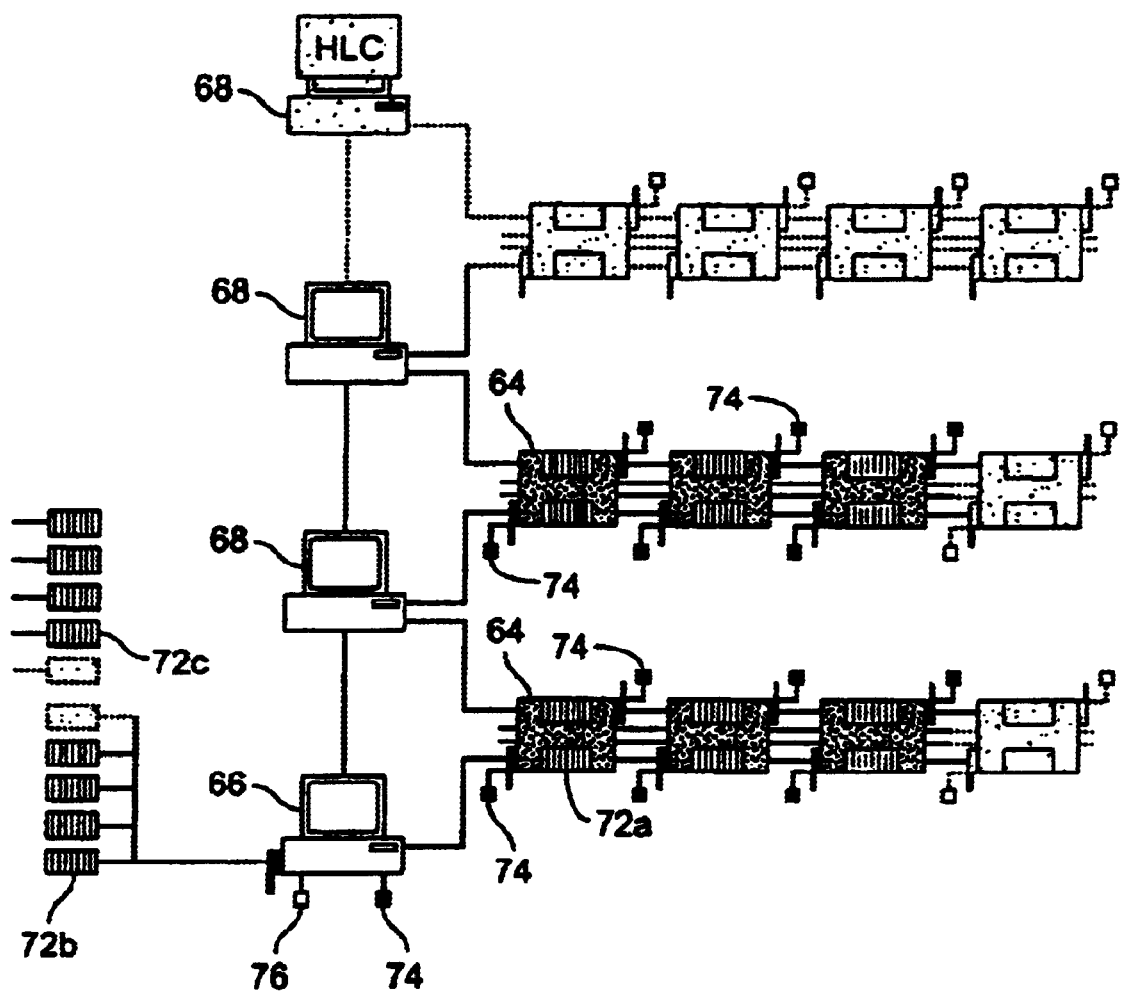

FIG. 10 is a system block diagram illustrating a typical multiple-line configuration in accordance with another embodiment of the present invention. As shown in FIG. 10, the system includes a plurality of lines each having a plurality of placement machines 64. As is well understood by those who having ordinary skill in the art, the system is expandable as desired by adding placement machines 64 to each line, and/or by adding lines and additional controllers 68 to the system as shown in FIGS. 9 and 10.

Methods of Operation.

Figure 11:
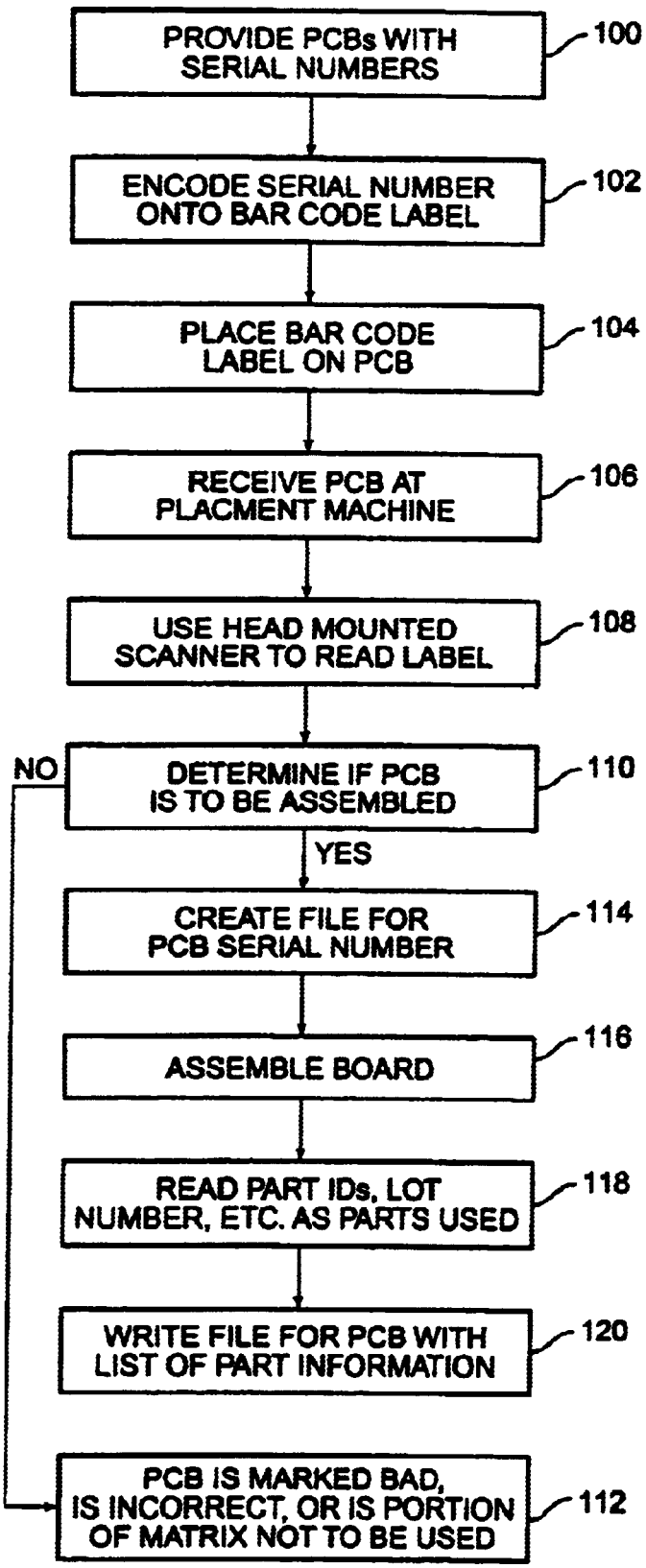
FIGS. 11–12 are process flow diagram illustrating various methods of operation in accordance with specific embodiments of the present invention.

The inventive structures and apparatus described above also make possible a number of innovative methods of operating placement equipment. For example, traceability may now be provided as illustrated in the flowchart of FIG. 11. At block 100 each PCB to be assembled is provided with a serial number or other unique identifier. At block 102 this unique identifier is coded into a barcode or other optically or otherwise remotely scannable representation which is placed on the PCB at block 104. At block 106 the PCB is received at the placement machine and at 108 a scanner reads a label associated with the PCB to obtain the PCB's unique ID such as a serial number. Preferably the label is of the bar code type and the scanner is a head-mounted bar code reader which moves with a pick-up head of the placement machine. The scanner may be a charge-coupled device (CCD) camera. In this way the head can locate the bar code scanner above the expected position of the label and read it.

Some PCBs are of the "matrix" type in that they contain a number of separable PCBs disposed in a matrix. Sometimes it is undesirable to place components on all of the members of the matrix, so it is possible to serialize all of them and select only some for assembly. It is also possible to mark a PCB as "bad" or "do not assemble" by making a mark on the label or crossing the label out. This mark or cross out can be readily detected with a bar code scanner. Thus, at block 110 the computerized controller which is coupled to the placement machine, its scanner, its head position controls, and the like, decides whether the PCB is to be assembled.

Where the PCB is not to be assembled (block 112) this is most probably due to the serial number read from the PCB correlating with a known bad serial number stored in the memory of the controller, a "bad" mark detected by a scanner, or the fact that the particular PCB is one of a matrix of a plurality of PCBs and the particular PCB has been deselected for assembly either by specifying its unique ID as deselected to the controller or by making a mark on its label which can be read by the scanner or which interferes with the scanning of the label.

If the PCB is to be assembled, at block 114 a record entry in a file of a memory such as a hard disk drive file associated with the controller computer is created for the particular PCB unique ID, and the PCB is assembled at block 116. As the assembly progresses, the record is modified by adding a list of part IDs, corresponding Lot Numbers, and optionally the serial number from the memory unit of the component feeder supplying the component, its position in the trolley of component feeders being used, and potentially other information of interest. This list is derived by reading the memory device associated with the intelligent component feeder and coping the information into the memory of the controller for the placement machine (Block 118). Once the file is complete, it is written into a desired form at block 120. In this way traceability is provided because the data from the file may be preserved and if a Lot Number of a particular part is ever determined to be potentially defective, the file can be searched to identify the PCB unique IDs which contain the potentially defective parts and then they can be located on that basis and checked or replaced, as warranted.

Figure 12:
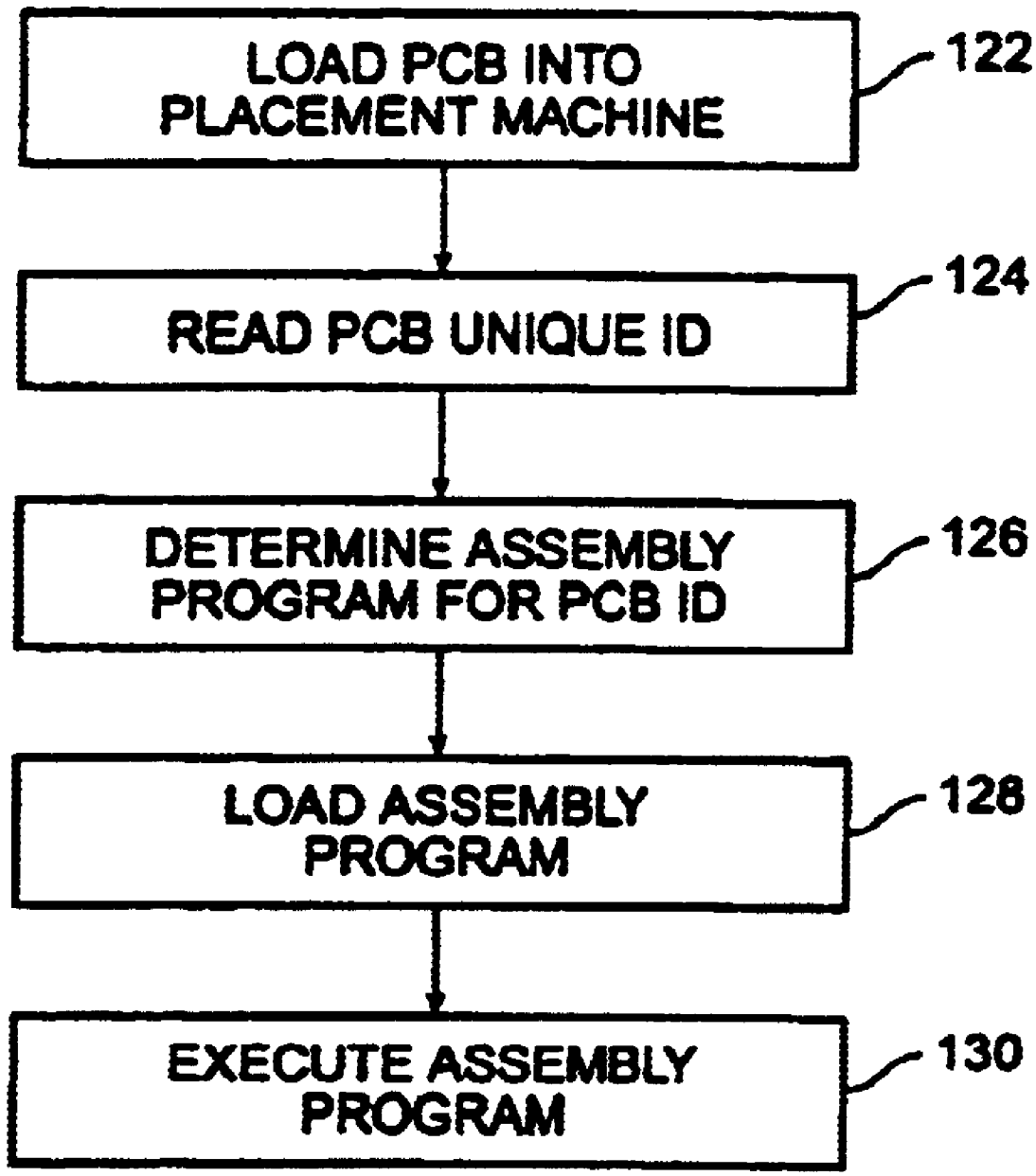

Additionally, the head-mounted scanner can be used to scan PCB bar codes to load jobs into the placement machine controller(s). As illustrated in FIG. 12, the PCB is loaded onto the placement machine at block 122. At block 124 the label on the PCB (preferably a bar code label) is read to determine either a unique ID for the PCB or a program ID to be applied to the PCB. At Block 126 the assembly program corresponding to the PCB is determined and at block 128 the assembly program is loaded into one or more controllers. At block 130 the assembly program is executed. In this way, if desired, a stack of PCBs could be assembled, each having a different assembly program, indeed each could be completely or only slightly different from one another.

In another aspect of the invention, a program known as a "setup wizard" reads the information available at the placement machine controller to extract component IDs, component feeder locations, and number of placements per part number. Additional information may also be used. The information is then used by the assembly equipment controller to select a component feeder for the job that has at least the appropriate number of remaining components (best case) or notifies the user that there are not enough components available on in-line component feeder trolleys. Aditionally, on-line component feeders can be identified as a possible source for the missing componets as can off-line component feeders and, of course, in-line component feeders. The controller software can also plan jobs and lock out components committed to previously planned jobs so that they are not used up prior to the scheduled job start.

An additional feature which may now provided by the controller software allows it to correct for problems associated with the removal of a component feeder and/or its possible replacement into an "incorrect" feeder slot (e.g., different from the one it was removed from). Because the component feeder has a unique ID which can be read over the CanBus network by the controller, if the component feeder is relocated, this can easily be detected and the pick and place program automatically modified so that the PCB continues to be properly assembled despite the change in the physical position of one of the component feeders.

In further accordance with this concept, it is possible for the placement machine controller to create a speed-optimized assembly program picking components from desired component feeders in desired positions for maximum efficiency, then set up the machine with the component feeders in essentially random order, and still assemble the PCBs as specified by the assembly program, albeit in a non-speed-optimized fashion. Similarly, a user can simply plug the component feeders into the In-Line trolley positions in any desired or random order, then the controller can upload the identifications of the feeders and their contents. The controller software can then be used to optimize production given the user's preselection of component feeder positions using well-known conventional production optimization software.

In accordance with a presently preferred embodiment of the present invention, each intelligent component feeder is checked in three ways prior to each pick of a component from that feeder. First, the software of the controller checks to see if a component feeder is in fact installed at the position where the assembly program expects to pick up a part. Second, the actual part ID number is checked (this information is copied from the memory unit of the intelligent component feeder to local random access memory (RAM) for the controller so that the check takes very little time) to verify that the part that is going to be picked up is the part that the assembly program expects to pick up. Third, a feeder verification flag is checked to make sure that the flag is set to .FALSE.—a state which indicates that there are no problems with the feeder. For example, if the feeder has been removed and then replaced, it is possible that it contains a different reel of parts. In this case, the feeder verification flag is set to .TRUE. and use of that feeder requires that the reel bar code label be rescanned.

If any of the above-identified checks fail, then the feeder is treated as empty and an appropriate error message is generated and assembly stops before a component is picked from the feeder. If the same component is available from another In-Line feeder, the software may optionally redirect the pick to that other component feeder rather than stop the assembly process.

The above features make possible real-time inventory control of both component parts and assembled PCBs. Each component reel has a unique serial number in addition to a component ID and Lot Number. As component reels are purchased, they are entered into a conventional inventory tracking system. As they are loaded onto component feeders, they are scanned and the system is aware that they are In-Line or On-Line. They may simply be deleted from stock at this point, or, for finer inventory resolution, as components are used from the reels, real-time inventory control is possible by simply linking the conventional inventory control system to the CanServer software running on the placement machine system controller to capture the use information generated by the placement machine system on a real-time basis. Automatic replenishment ordering may then be performed by the inventory control system when stocks drop below predetermined thresholds.

Loading a component reel onto an intelligent component feeder in accordance with a specific embodiment of the present invention is performed as follows. First, the reel is obtained. Reels generally have a bar code label which identifies part ID, lot number, quantity and the like. If no bar code label is available, one is fabricated by manually entering the information into the placement machine controller and printing an appropriate bar code label on a bar code label printer. The reel is then scanned by a bar code scanner and loaded and threaded into the component feeder. The results of the scan are downloaded to the memory unit of the component feeder once it is secured to the placement equipment and is In-Line or On-Line. To unload a component reel, one prints a new bar code label for the reel reflecting the current (approximate) contents of the reel, demounts the component feeder, removes the component reel, and places the new bar code label over the existing bar code label.

Feeder status is preferably tracked by the placement machine controller as follows. All connected feeders (On-Line or In-Line) are given the status "Reserved", "In Use" or "Available". Reserved is given to feeders which are currently being loaded for the next assembly job. In Use is given to feeders currently being used for production. Available is given to feeders which are neither Reserved nor In Use.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An intelligent component feeder comprising:
   a mechanically powered component feed system; and
   a memory device mounted on said component feed system, said memory device having a two-terminal electrical interface, the two terminals being respectively associated with data and data ground, the terminal associated with data ground being coupled with a body of said intelligent component feeder.

2. An intelligent component feeder according to claim 1, wherein said memory device contains information indicating at least one of a component ID, component Lot Number, feeder serial number, feeder type, number of feeder actuations, and a Quantity value for a reel of components mounted on the component feeder.

3. An intelligent component feeder according to claim 1, wherein said memory device is of a non-volatile, rewritable type.

4. An intelligent component feeder according to claim 1, further comprising a data connector for coupling data from said memory device to a data adapter of a placement device, said data connector coming into contact with the data adapter when said intelligent component feeder is installed on the placement device.

5. A method of converting a mechanical component feeder to an intelligent component feeder, said method comprising:
   providing a memory device having a two-terminal electrical interface to the mechanical component feeder, the two terminals associated with data and data ground, the terminal associated with data ground is coupled with a body of said intelligent component feeder; and
   providing a data connector for coupling data from said memory device to a data adapter of a placement device.

6. A method according to claim 5, further comprising:
   storing in said memory device information indicating at least one of a component ID, component Lot Number, feeder serial number, feeder type, number of feeder actuations, and a Quantity value for a reel of components mounted on the component feeder.

7. A placement machine comprising:
   a plurality of receiving stations disposed in a row for receiving intelligent component feeders, each intelligent component feeder being mechanically operated and having a memory device;
   a plurality of data lines for coupling one per intelligent component feeder attached to the corresponding receiving station, each data line receiving data from the memory device of the corresponding intelligent component feeder; and
   a data ground line for coupling with a body of each of said intelligent component feeders, for receiving ground returns from each body of said intelligent component feeders.

8. A placement machine according to claim 7, further comprising:
   a printed circuit board attached thereto, on which said plurality of data lines are provided; and
   a plurality of spring connectors mounted on said printed circuit board, each spring connector coupled to corresponding one of said plurality of data lines.

9. A placement machine according to claim 8, further comprising a gripper bar to which the intelligent component feeders are clamped in normal operation, said data ground line being coupled to said gripper bar.

10. A placement machine according to claim 8, further including a block connector for coupling said data lines to a placement machine controller via a cable.

11. A placement machine according to claim 7 wherein the memory device includes a two-terminal electrical interface, the two terminals being respectively associated with data and data ground, the terminal associated with data ground being coupled with the body of the corresponding intelligent component feeder.

12. A placement machine for assembling printed circuit boards, said placement machine comprising:
   a pick-up head moveable over a substrate to be assembled, for picking up a component from an intelligent component feeder, and for placing the component on a placement location on the substrate; and
   an information reader mounted on said pick-up head, said information reader being oriented to observe identification information of the substrate.

13. A placement machine according to claim 12, wherein said information reader is a barcode scanner or CCD camera, and said identification information is in a form of barcode label.

14. A method of operating a placement machine for assembling printed circuit boards, the placement machine having a pick-up head with an information reader and including a plurality of intelligent component feeders, each intelligent component feeder having a memory device, said method comprising:

providing a printed circuit board with a unique identifier;

placing said printed circuit board at said placement machine;

scanning said unique identifier of said printed circuit board using the information reader;

determining whether said printed circuit board is to be assembled based on said scanning;

creating a file for said printed circuit board when said printed circuit board is to be assembled;

assembling said printed circuit board;

reading component data from the memory device of each intelligent component feeder used for said assembling; and writing said component data into said file.

15. A method according to claim 14, wherein said providing includes:

encoding said unique identifier into a form of remotely readable representation; and placing said remotely readable representation of the unique identifier on said circuit board.

16. A method according to claim 14, wherein said scanning includes:

locating the information reader above an expected position of the printed circuit board.

17. A method according to claim 14, wherein said component data includes a component ID, component Lot Number, feeder serial number, feeder type, number of feeder actuations, and a Quantity value for a reel of components mounted on the corresponding component feeder.

18. A method according to claim 17, wherein the component data further includes ID information identifying the intelligent component feeder from which the component is fed, and information indicating a position in a trolley of the intelligent component feeder.

19. A method according to claim 18, further comprising:

before said assembling, checking whether the intelligent component feeder is installed at a position where the assembly program expects to pick up a part;

checking a part identification number to verify the part to be picked up, by reading data from the memory device of the intelligent component feeder; and checking a feeder verification flag to determine whether a reel of parts is to be verified.

20. A method according to claim 14, wherein said plurality of intelligent component feeders are mounted on a feeder trolley, said method further comprising:

providing at least one additional feeder trolley having a plurality of intelligent component feeders mounted thereon;

providing a controller for controlling operations of said placement machine and said at least one additional feeder trolley; and networking said controller, said placement machine, and said at least one additional feeder trolley.

21. A method according to claim 20, wherein said at least one additional feeder trolley is networked using wireless communication.

22. A method according to claim 20, wherein said plurality of intelligent feeders and said feeder trolley communicate using wireless communication.

23. A method of operating a placement machine for assembling printed circuit boards, the placement machine having a pick-up head with an information reader, said method comprising:

placing a printed circuit board onto the placement machine;

reading a unique identifier attached to the circuit board using the information reader;

determining an assembly program corresponding to the printed circuit board based on said reading of said unique identifier;

loading said assembly program onto a placement machine controller; and executing said assembly program and assembling the printed circuit board accordingly.

* * * * *